US011698779B2

(12) United States Patent
Main et al.

(10) Patent No.: US 11,698,779 B2
(45) Date of Patent: Jul. 11, 2023

(54) SYSTEMS USING COMPUTATION GRAPHS FOR FLOW SOLVERS

(71) Applicant: ANSYS, INC., Canonsburg, PA (US)

(72) Inventors: Geoffrey Alexander Main, Canonsburg, PA (US); Raunak Deepak Borker, Canonsburg, PA (US)

(73) Assignee: ANSYS, INC., Canonsburg, PA (US)

( * ) Notice: Subject to any disclaimer, the term of this patent is extended or adjusted under 35 U.S.C. 154(b) by 0 days.

(21) Appl. No.: 17/009,295

(22) Filed: Sep. 1, 2020

(65) Prior Publication Data

US 2022/0066755 A1  Mar. 3, 2022

(51) Int. Cl.

| G06F 8/41 | (2018.01) |
|---|---|
| G06F 11/36 | (2006.01) |
| G06F 9/48 | (2006.01) |
| G06F 12/06 | (2006.01) |
| G06F 9/445 | (2018.01) |

(52) U.S. Cl.
CPC .............. *G06F 8/44* (2013.01); *G06F 9/445* (2013.01); *G06F 9/4881* (2013.01); *G06F 11/362* (2013.01); *G06F 12/0646* (2013.01); *G06F 2212/1008* (2013.01)

(58) Field of Classification Search
CPC .......... G06F 8/44; G06F 9/445; G06F 9/4881; G06F 11/362; G06F 12/0646; G06F 2212/1008

See application file for complete search history.

(56) References Cited

U.S. PATENT DOCUMENTS

| 7,464,373 | B1 * | 12/2008 | Yunt .................. G06F 11/3664 717/125 |
|---|---|---|---|
| 7,590,970 | B2 * | 9/2009 | Bromley .............. G05B 19/056 700/17 |
| 7,904,280 | B2 * | 3/2011 | Wood .................... G06F 30/20 703/2 |
| 10,338,782 | B2 * | 7/2019 | Stanfill ................. G06F 3/048 |
| 10,713,015 | B2 * | 7/2020 | Laethem ............... G06F 3/0482 |
| 11,354,463 | B1 * | 6/2022 | Babaali .................... G06F 8/35 |
| 11,360,747 | B1 * | 6/2022 | Ciolfi ........................ G06F 8/34 |
| 2002/0083413 | A1 * | 6/2002 | Kodosky ................. G06F 8/34 717/109 |

(Continued)

OTHER PUBLICATIONS

Patrick K. Notz, Roger P. Pawlowski, James C. Sutherland, "Graph-Based Software Design for Managing Complexity and Enabling Concurrency in Multiphysics PDE Software", ACM Transactions on Mathematical Software, Jan. 2011, 25 pages.

(Continued)

*Primary Examiner* — Douglas M Slachta
(74) *Attorney, Agent, or Firm* — Womble Bond Dickinson (US) LLP

(57) ABSTRACT

An embodiment of a method can create a directed acyclic graph (DAG) from a programmer specified set of computation units to solve, in a computer program, physics based simulations of physical systems, and the DAG can be used to analyze and debug the computer program. In this method, the computer program can be created by automatically determining dependency relationships in the set of computation units and automatically schedule their execution. The method can also automatically allocate memory for the computation units.

20 Claims, 11 Drawing Sheets

(56) References Cited

U.S. PATENT DOCUMENTS

| | | | | |
|---|---|---|---|---|
| 2007/0157162 A1* | 7/2007 | Ciolfi | ............ | G06F 8/35 714/E11.207 |
| 2007/0168065 A1* | 7/2007 | Nixon | ............ | H04L 67/36 700/83 |
| 2008/0059739 A1* | 3/2008 | Ciolfi | ............ | G06F 30/20 703/13 |
| 2009/0037659 A1* | 2/2009 | Kimura | ............ | G06F 11/3452 711/125 |
| 2009/0049424 A1* | 2/2009 | Kumar | ............ | G06F 8/34 717/109 |
| 2009/0178025 A1* | 7/2009 | Morrow | ............ | G06F 8/34 717/109 |
| 2011/0078662 A1* | 3/2011 | Hudson, III | ............ | G06F 11/3664 717/125 |
| 2012/0030646 A1* | 2/2012 | Ravindran | ............ | G06F 8/34 717/105 |
| 2012/0030650 A1* | 2/2012 | Ravindran | ............ | G06F 9/4494 717/107 |
| 2013/0116986 A1* | 5/2013 | Zhang | ............ | G06F 30/20 703/2 |
| 2013/0185047 A1* | 7/2013 | Jackson | ............ | G06F 30/20 703/22 |
| 2014/0101636 A1* | 4/2014 | Correll | ............ | G06F 8/34 717/113 |
| 2019/0079854 A1* | 3/2019 | Lassance Oliveira E Silva | ............ | G06F 11/3692 |
| 2020/0258509 A1* | 8/2020 | Bharadwaj | ............ | H04L 51/02 |

OTHER PUBLICATIONS

Tony Saad, James C. Sutherland, "Wasatch: An architecture-proof multiphysics development environment using a Domain Specific Language and graph theory", Journal of Computational Science, 2016, 8 pages.

Martin Berzins, Qingyu Meng, John Schmidt, James C. Sutherland, "DAG-Based Software Frameworks for PDEs", Euro-Par 2011 Workshops; Part 1, LNCS 7155, pp. 324-333, 2012.

* cited by examiner

FIG. 3C

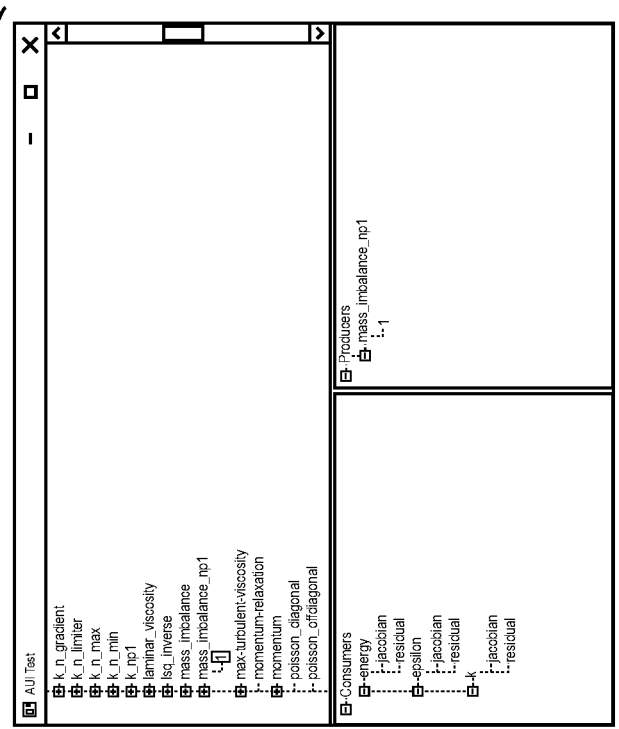

```
auto post_binder = [] (Rules::KernelBinding<ComputeSmagorinskyViscosity>& bindings,
    const UnstructuredMesh::CellZone& interior_cell_zone)
{
    binding << vector_bind(interior_cell_zone,
        "cell_volumes", &ComputeSmagorinskyViscosity::cell_volumes)
    << vector_bind(interior_cell_zone, "gradient_u",
        &ComputeSmagorinskyViscosity::gradient_u_view)
    << vector_bind(interior_cell_zone, "gradient_v",
        &ComputeSmagorinskyViscosity::gradient_v_view)
    << vector_bind(interior_cell_zone, "gradient_w",
        &ComputeSmagorinskyViscosity::gradient_w_view)
    << Rules::cpu_bind_in("turbulence-model/Cs",
        &ComputeSmagorinskyViscosity::Cs)
    << vector_bind(interior_cell_zone, "viscosity_t",
        &ComputeSmagorinskyViscosity::viscosity);
```

Defining inputs and outputs ← 201

A list of all the variables in the entire code ← 203

DAG based on example
in FIG. 3D

SYSTEMS USING COMPUTATION GRAPHS FOR FLOW SOLVERS

BACKGROUND

This disclosure relates to systems that produce simulated results of a physical system such as simulated results of the operation of a jet engine. In particular, this disclosure relates to software that produces these simulated results.

Designers and manufacturers are increasingly using computer aided design (CAD) and computer aided engineering (CAE) systems, such as computers that execute simulation software, to design products such as automobiles, airplanes, airplane engines, heating and cooling systems, etc. The use of such CAD or CAE systems allow the designers and manufacturers to test out different designs using the software without requiring that the design be built. For example, thermo-mechanical fatigue testing or thermal analysis of a proposed product, based on a design, can be performed on a simulated design of the product before the product is fabricated to determine when and how the product will fail. Similarly, a design of an airplane's wing, or other part, can be tested in the CAD system before the wing is fabricated to determine how well the wing will behave based on, for example, fluid flow of air around the wing while in flight. This testing by simulation can allow a designer to consider different possible designs and reject some of them based on the results of the simulation before the product is even fabricated. Moreover, results of one or more simulations can cause a designer to revise the design to improve its behavior or performance.

Existing physics based simulation software, such as Fluent from ANSYS Inc. of Canonsburg, Pa., includes complex software written by human programmers to produce the solutions. The software is developed by writing explicit lines of code to cause the computation of various equations in a series of operations and calculations that produce the simulation results. The code is not designed to reveal the series except by careful inspection of the code. Thus, modifications of the software to use modified operations (or new operations to replace some of the existing operations, such as the incorporation of new models or theories) requires careful inspection of the code to integrate the modifications into the existing code. It is difficult to grasp the overall flow and algorithm except by careful inspection of the many lines of code. Moreover, this software architecture requires careful manual techniques to allocate memory for the software. Thus, existing methods of developing this software require a great deal of work.

SUMMARY OF THE DESCRIPTION

This disclosure describes various embodiments that can use one or more computation graphs, such as a graph in the form of a directed acyclic graph, to develop software for use in physics based simulations. An embodiment of a method can create a directed acyclic graph (DAG) from a programmer specified set of computation units to solve, in a computer program, physics based simulations of physical systems, and the DAG can be used to analyze and debug the computer program. In this method, the computer program can be created by automatically determining dependency relationships in the set of computation units defined by the one or more programmers and automatically schedule their execution. The method can also automatically allocate memory for the computation units.

A method for creating software that performs physics simulations can include the following operations: defining a set of computation units for simulating a physical system, each computation unit comprising one or more variables associated with characteristics of the physical system, and the one or more variables comprising a set of input and output variables; automatically determining a set of dependency relationships among the computational units based upon the variables in all of the computation units; automatically generating a representation of a schedule of execution for the computation units based on their determined dependencies; and storing an executable representation of the computation units with an execution order specified by the schedule, the executable representation being stored as part of the software. In one embodiment, the method can further include the operation of: automatically specifying memory allocations for the computation units based on the determined dependencies; for example, the method can use a memory coloring algorithm to allocate memory for non-persistent data such as variables in the computation units.

In one embodiment, the stored computation units, which have their execution order specified by the schedule, represent a computation graph that is presentable as a directed acyclic graph (DAG) having a set of nodes, each of the nodes representing one of the computation units. In one embodiment, each computation unit is a function or equation represented in a computer programming language. A computation unit can also be referred to as a rule. Each of the variables in the set of input and output variables can be defined by a unique string of characters and a type of variable in one embodiment.

In one embodiment, the method can further include the operation of: displaying the DAG on a display device, wherein the DAG is a finite directed graph with no cycles, and the DAG specifies the flow of computations among the computation units. In one embodiment, the method can also include the operation of: displaying, while debugging the software, a "redline" comparison of the values of the input and output variables at each stage of the execution of the DAG. In one embodiment, the DAG can be automatically constructed by a data processing system, which executes a program development environment, from the definition of the set of computation units by one or more human programmers.

In one embodiment, the method can also include the operation of: executing the computations in the computation units in an order specified by the schedule once for each iteration through the DAG, wherein the method uses multiple iterations to derive a converged solution in a simulation.

The aspects and embodiments described herein also include systems (e.g., data processing systems such as general purpose computers) that can perform the one or more embodiments.

The aspects and embodiments described herein can include non-transitory machine readable media that can store executable computer program instructions that when executed cause one or more data processing systems to perform the methods described herein when the computer program instructions are executed. The instructions can be stored in non-transitory machine readable media such as in dynamic random access memory (DRAM) which is volatile memory or in nonvolatile memory, such as flash memory or other forms of memory.

The above summary does not include an exhaustive list of all embodiments are aspects in this disclosure. All systems, media, and methods can be practiced from all suitable combinations of the various aspects and embodiments summarized above and also those disclosed in the detailed description below.

BRIEF DESCRIPTION OF THE DRAWINGS

The present invention is illustrated by way of example and not limitation in the figures of the accompanying drawings in which like references indicate similar elements.

FIG. 3C shows an example of how inputs and outputs for a computation unit or rule can be defined and shows a user interface of a program development environment (or an end user's user interface) that shows all of the variables in the computation units used for a particular physics based simulation.

DETAILED DESCRIPTION

Various embodiments and aspects will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments.

Reference in the specification to "one embodiment" or "an embodiment" means that a particular feature, structure, or characteristic described in conjunction with the embodiment can be included in at least one embodiment. The appearances of the phrase "in one embodiment" in various places in the specification do not necessarily all refer to the same embodiment. The processes depicted in the figures that follow are performed by processing logic that comprises hardware (e.g. circuitry, dedicated logic, etc.), software, or a combination of both. Although the processes are described below in terms of some sequential operations, it should be appreciated that some of the operations described may be performed in a different order. Moreover, some operations may be performed in parallel rather than sequentially.

Figure 1:
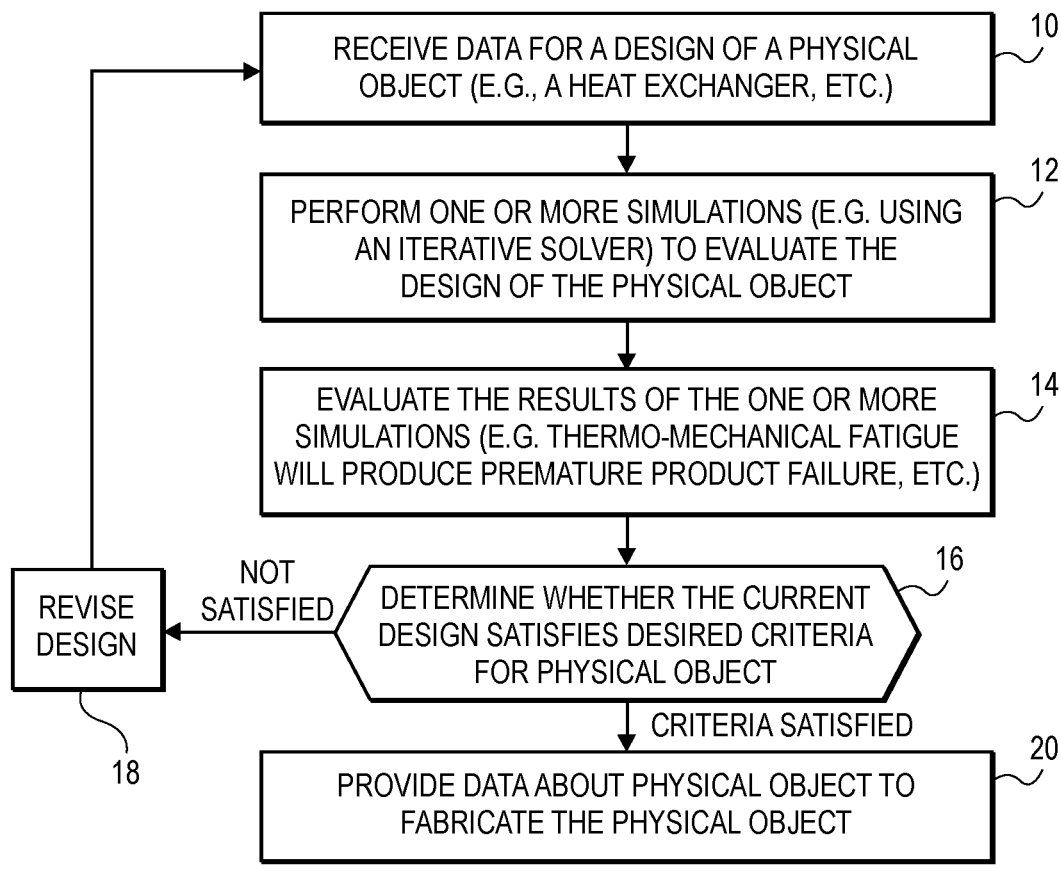
FIG. 1 is a flowchart which illustrates a method which can be used according to one or more embodiments described herein to design and fabricate a physical object such as an airplane wing or a pump, etc.

The embodiments described herein can be used to obtain solutions for models of a physical system, where the models are based on a set of one or more equations such as partial differential equations. These models can be used in simulations of physical objects and physical systems in order to determine whether a particular design of the physical object or physical system satisfies particular requirements for the object or system. For example, there might be certain design requirements for how an airplane wing should operate while the airplane is flying through a fluid such as air. Similarly, there may be certain design requirements for a heat exchanger which includes pipes and other components in the heat exchanger. FIG. 1 shows a method in which these design requirements can be tested relative to a particular design of a physical object or physical system which is being simulated. In operation 10 of FIG. 1, a data processing system can receive data about a design for a particular physical object. The data can be created in CAD software on a data processing system, and the data can include information about the materials used to fabricate the physical object as well as sizes of different parts of the physical object, the shape of the physical object, etc. Then in operation 12, the data processing system can perform one or more simulations (such as simulations based on computational fluid dynamics) to evaluate the design of the physical object. In one embodiment, the data processing system can perform simulations by using an iterative solver which converges upon a solution for the PDE that specifies parameters relative to the physical object in the simulation. For example, the airplane wing may be subjected to various different fluid flows during the simulation, and information from the simulation may indicate how well or poorly the particular design of the airplane wing performs, such as the amount of lift it can provide, etc. In operation 14, the designer can evaluate the results of one or more simulations to determine whether the design of the physical object satisfies certain desired criteria for the physical object. For example, the designer can determine whether the expected failure rate or product lifecycle indicated in the simulation's results satisfy desired criteria for the physical object. This determination is shown in operation 16. If the one or more criteria is satisfied, then the designer in operation 20 can provide data about the physical object to allow the fabrication or manufacture of the physical object. For example, if the criteria is satisfied, a CAD file can be produced that describes how to build the physical object such as an airplane wing. If the criteria are not satisfied as determined in operation 16, the designer can revise the design in operation 18 (for example, by changing sizes or shapes of parts in the physical object or changing the composition of material(s) in the object, etc.) and repeat the process by performing additional further simulations to evaluate the redesigned physical object. This can be repeated until the desired criteria are achieved for the physical object, and may require the designer change the design in terms of the materials used and other parameters that describe how the physical object will be fabricated or otherwise produced.

Figure 2A:
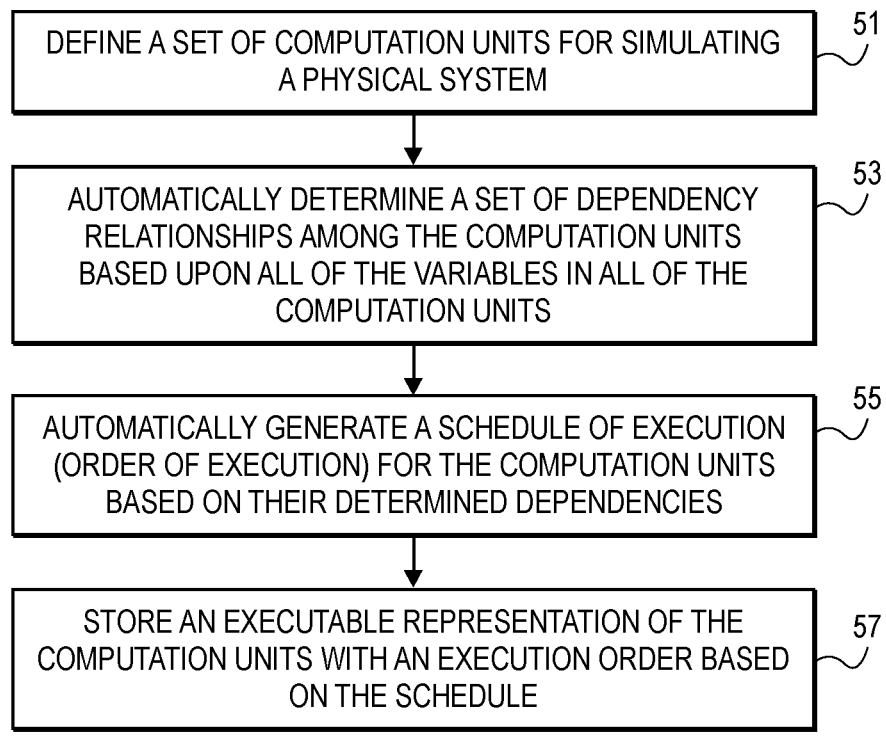
FIG. 2A is flowchart that shows a method according to one embodiment that can be used to create a computer program that can be used to simulate physical systems.
Figure 2B:
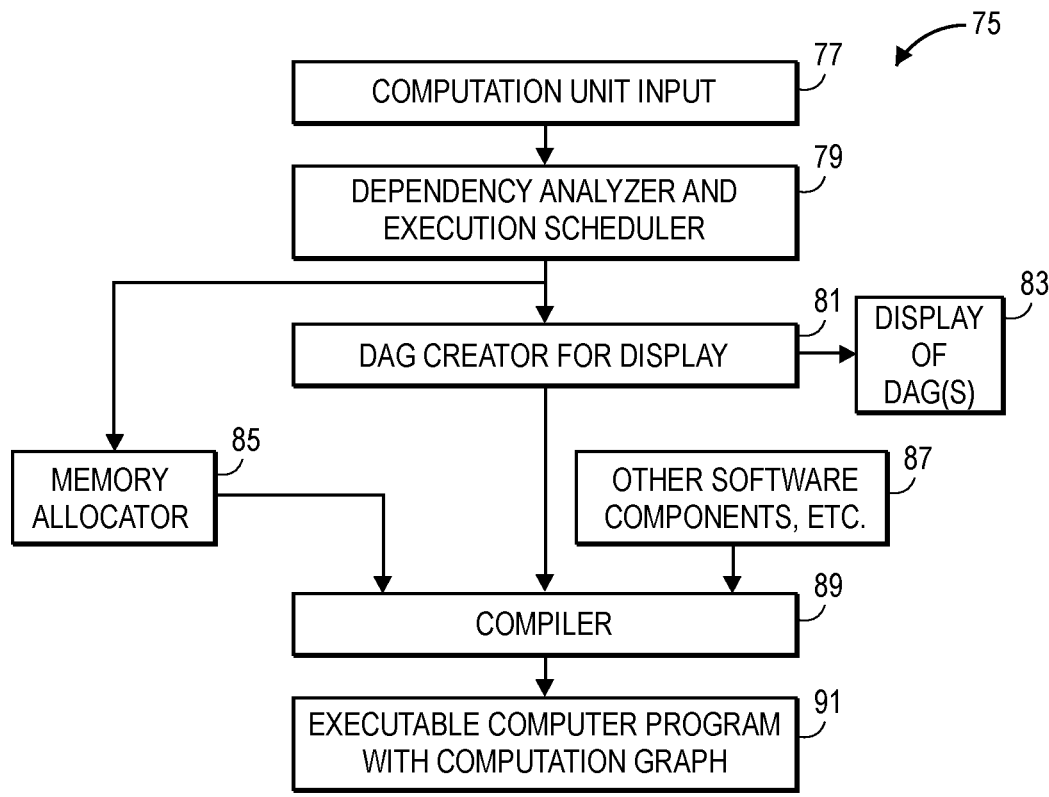
FIG. 2B shows an example of a program development environment that can be provided, according to one embodiment, on a computer system.

The embodiments described herein can be used to create one or more computer programs that can perform the simulations in FIG. 1. FIG. 2A shows an embodiment of a method to create such a computer program. In operation 51, one or more human computer programmers define a set of computation units (e.g., C like functions or equations expressed in a computer programming language) that define a set of computations used in the simulation. Further details about this definition are provided below. In operation 53, a data processing system (e.g., a program development environment) receives these definitions and automatically determines a set of dependency relationships among the computation units based upon all of the variables in all of the computation units. Further details about determining these dependency relationships are provided below. Then in operation 55, the data processing system automatically determines or generates a schedule of execution for the set of computation units. This generation of the schedule establishes the order, or sequence over time, for when the software representing the computation units will be executed and is based on the determined dependencies of the computation units (which was determined in operation 53). Further details about automatically generating the schedule are provided below. Once the schedule of execution has been determined, the data processing system in operation 57 can store an executable representation of the computation units, with their execution order specified in the representation, in a computer program that can be used to perform simulations based on the equations embodied in the computation units. For example, the computer program can perform simulations based on computational fluid dynamics (CFD) or other types of physics based or engineering simulations known in the art. In one embodiment, operation 57 could include storing the available computational units in compiled form so that a schedule and execution order can be determined automatically when the executable object code deployed to customers or licensees of the computer program is executed. The executable representation of the computation units can be part of a larger package of software that performs CAD or CAE, such as Fluent, HFSS, Icepak, or other software products from ANSYS Inc. The method shown in FIG. 2A can be performed in a program development environment that is used by programmers to write and develop a computer program, and FIG. 2B shows an example of a program development environment that can be used in one embodiment. The method in FIG. 2A can also performed by a user of a computer program that has been developed to allow use of a computation graph defined at runtime of the computer program by a user (e.g., customer or licensee of the computer program).

Referring now to FIG. 2B, a program development environment 75 can be implemented on a data processing system (e.g., a general purpose computer) that uses software development tools to allow human programmers to create a computer program or set of computer programs that can operate together. The program development environment 75 can be used to create a computer program that includes an input component 77, such as a software user interface configured to receive, through a keyboard or touchscreen or other known input device, definitions of the computation units; for example, an input component 77 of the computer program can receive the definition of a set of computation units from operation 51 in FIG. 2A. The computer program can also include a component 79 which includes a dependency analyzer and an execution scheduler which can perform operations 53 and 55 shown in FIG. 2A. Component 79 uses the definition of the set of computation units provided by one or more programmers to determine a set of dependency relationships among the computation units based upon all of the variables in all of the computation units in the simulation. The execution scheduler in component 79 can automatically generate a schedule of execution for the computation units based upon their determined dependencies.

The computer program developed in the program development environment 75 can also include a graph creator 81 that can create a directed acyclic graph (DAG) which can be displayed on a display device 83 of the program development environment 75. The display device 83 can display a current DAG that is under development and can also be used to show a comparison of the values of the input and output variables at each stage of the execution of a prior DAG and a current DAG, where the comparison is between the prior DAG for a prior version of the software and the current DAG (for a current version of the software) when debugging the current version of the software. One or more such comparisons can be used to diagnose or debug the software program or simulator. For example, the comparison can be used to show changes caused by addition of new computation units or removal of computation units, and the comparison can also be used to show changes within a computation unit (such as a change in an equation used in the computation unit). The comparison can also show a comparison of the outputs of each computation unit as a result of a change to the definitions of one or more of the computation units. In one embodiment, these one or more comparisons can also be presented during the process of defining a revised set of computation units if a user is diagnosing or debugging the simulator or computer program.

Figure 3A:
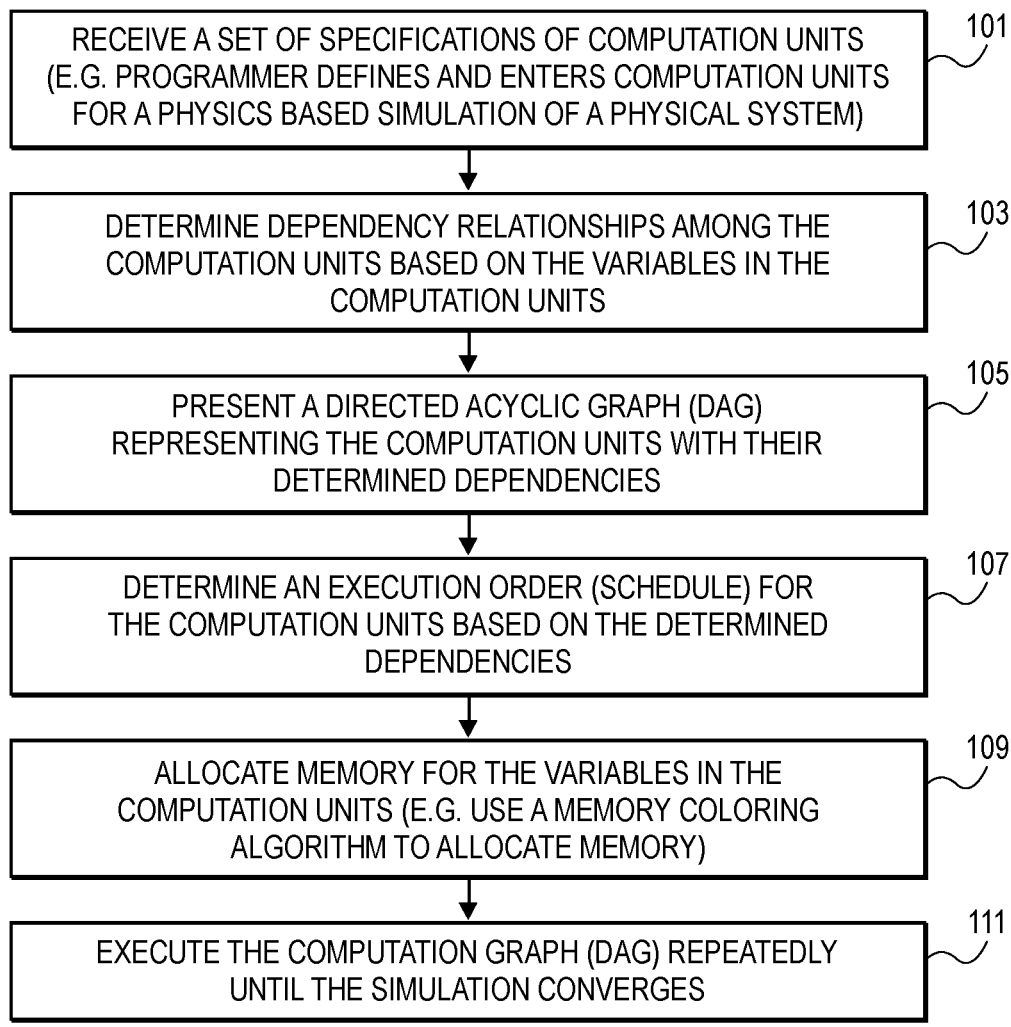
FIG. 3A depicts a flowchart which shows a method according to one embodiment that can be used to create a computer program that can be used to simulate physical systems.
Figure 4A:
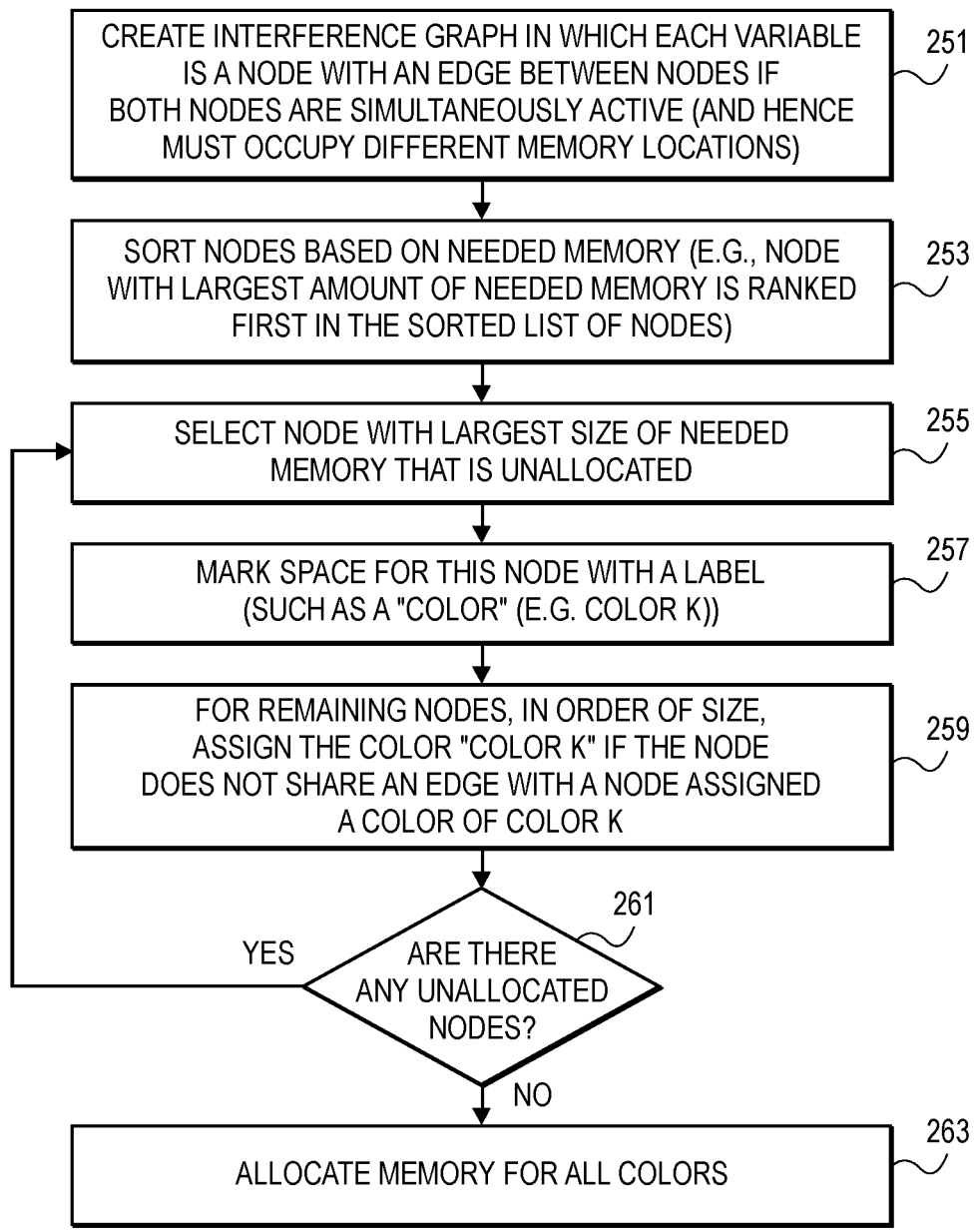
FIG. 4A is a flowchart that shows a method of memory allocation according to one embodiment.
Figure 4B:
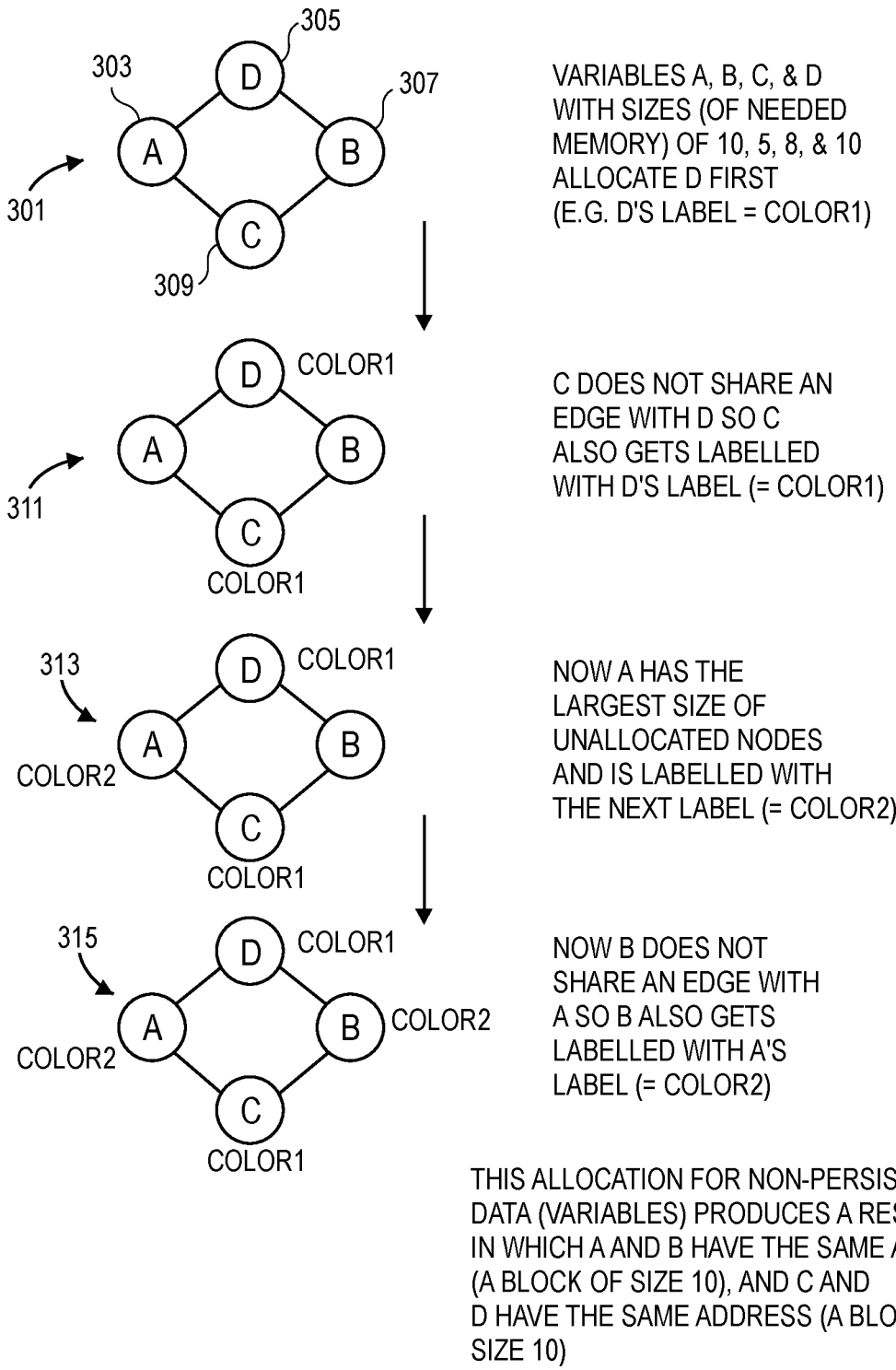
FIG. 4B shows how an interference graph can be used with the method of FIG. 4A to create a schedule or execution order for the computation units.

The program development environment 75 can also create, in one embodiment, a runtime engine for a memory allocator 85 which can operate according to the one or more methods described herein with respect to automatic memory allocation, such as the automatic memory allocation described in FIGS. 4A and 4B. The program development environment 75 can also process other software being created for other software components 87. These other software components 87 can be combined with the other components created in the program development environmentto create a final version of the software which can be compiled by compiler 89 to produce an executable computer program 91 which can automatically construct computation graphs derived from, for example, the method shown in FIG. 2A or the method shown in FIG. 3A. This executable computer program can then be distributed to customers or licensees of the computer program, and such customers or licensees can use the computer program to perform physics based simulations using the computer program. The program development environment 75, in one embodiment, can be used by one or more programmers (at a licensor of the software) who create the software for use by customers or licensees who subsequently use the created software to simulate physical systems without having to define the computation units. In this embodiment (shown in FIG. 2B), the one or more programmers define the computation units and then the software processes the computation units to determine dependencies and then the program development environment 75 generates an executable that has the dependencies analyzed for the particular problem (e.g., a set of equations) used in the simulation. In this embodiment, the customers or licensees do not need to define the computation units (although in one implementation of this embodiment, the computation units, initially defined by the licensor, may be editable by the customers or licensees). In an alternative embodiment, the executable program created by the one or more programmers does not include a definition of the computation units, but rather the executable program includes software components (created by the one or more programmers at the licensor) that can receive (from one or more customers) the definitions of the computation units and process those definitions to determine dependencies and then schedule execution of the computation units and also allocate memory using the methods described herein during runtime of the executable program. In this alternative embodiment, the customers or licensees can use the comparison tool described herein to debug or diagnose the simulator being created by the customer or licensee. In the embodiment shown in FIG. 2B, the one or more programmers at the licensor can also use the comparison tool to debug or test the program under development.

FIG. 3A shows an example of another method according to an embodiment in which a computer program used in physics based simulations is created through the development of a computation graph embodied within the computer program and representing a set of computation units which are used at runtime to perform calculations used in a physics based simulation. In operation 101 shown in FIG. 3A, a data processing system receives a set of specifications of computation units. For example, one or more human programmers can define and enter data about the computation units for a physics based simulation of a physical system, and the data entered can define the computation units by specifying, for each computation unit, all of the variables used for that computation unit and by specifying the type of each of the variables such as an input variable or an output variable. Each computation unit is associated with one or more variables, and each variable can be associated with a characteristic of the physical system such as variables used in the computation of CFD simulations (e.g., velocity, pressure, density, etc.) or other physics based simulations. Each computation unit can resemble a C function or a C++ function or an equation represented in computer programming language and each computation unit can generate values of one or more output variables from values of one or more input variables. In operation 103, the data processing system can automatically determine dependency relationships among the computation units based on the variables in the computation units. The determination of dependency relationships is based on the input and output variable of each of the computation units as explained further below. Then in operation 105, the data processing system can present (e.g., display on a display device) a directed acyclic graph (DAG) that represents the computation units with their determined dependencies; in this context the DAG is a computation graph. Each node in the DAG can represent one of the computation units. The sequence of the nodes in the graph specify a computational flow that is an ordered sequence or series of computations that run to produce a set of outputs, and the flow of processing (execution of the computation units) can be based upon the dependency relationships determined in operation 103. FIG. 3E shows an example of a DAG having nodes, each node representing one of the computation units. The display of the DAG on a display device (e.g., computer monitor) enables one or more programmers to visualize the entire computational procedure, making algorithm debugging easier. Also, the graph can be differentiated automatically to compute adjoints. The computation graph or DAG is not explicitly defined by the one or more human programmers, rather it is generated automatically from the defined input and output variables.

Figure 4C:
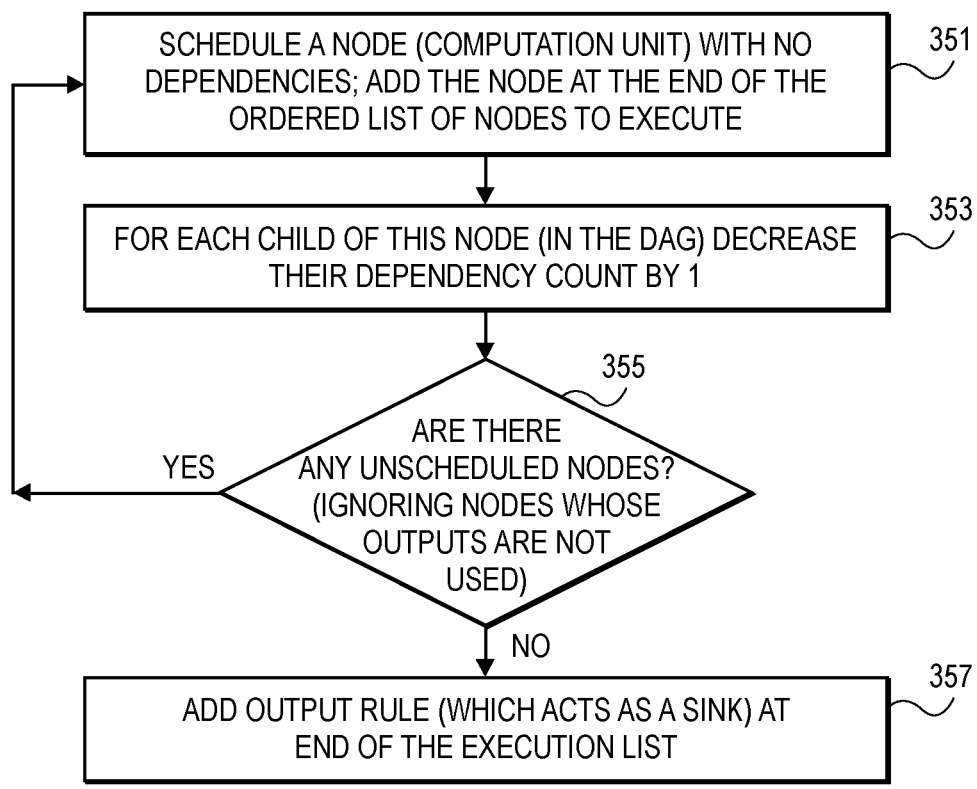
FIG. 4C is a flowchart that shows a method for scheduling execution of the computation units according to one embodiment.

Referring back to FIG. 3A, in operation 107, the data processing system can determine an execution order which represents a schedule that specifies the order of execution in time for each of the computation units based upon the determined dependencies which were determined in operation 103. An example of a method for automatically generating a schedule is shown in FIG. 4C and will be described below in conjunction with FIG. 4C. In operation 109, the method shown in FIG. 3A can automatically allocate memory for the variables in the computation units. In one embodiment, a method can use a memory coloring algorithm to allocate memory, and FIGS. 4A and 4B provide an example of such an algorithm to automatically allocate memory to non-persistent data in the computation units, such as the variables which are not persistent and can change during the computations for the simulation. The method in FIG. 3A can also include the execution of the computation graph, such as a DAG, and the execution of the computation graph can occur repeatedly until the simulation solution converges. Execution through the computation graph in one embodiment occurs in one iteration without any cycles during that iteration and thus proceeds from the beginning to the end through the computation graph (e.g., DAG) without any loops, but the next iteration will proceed through the computation graph again (without any loops in the next iteration) until the simulation solution converges based upon a convergence criterion or criteria. Multiple iterations through the computation graph or DAG will typically be used in order to reach a converged simulation solution.

Figure 3B:
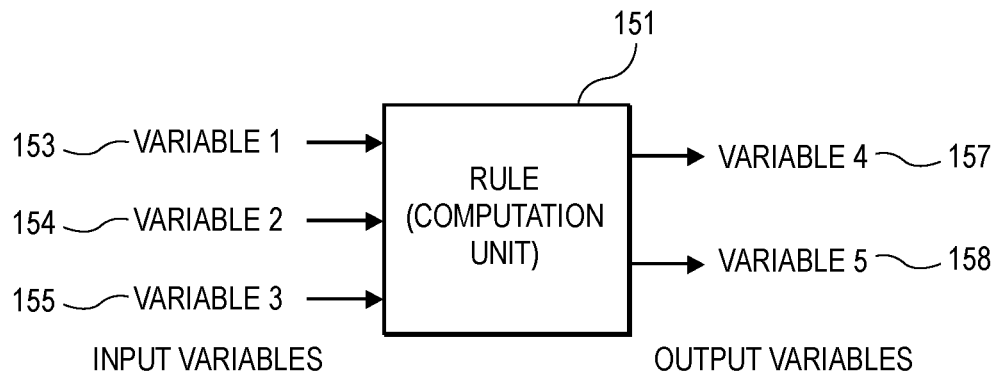
FIG. 3B shows an example of a computation unit or rule that has a set of input variables and a set of output variables.

FIG. 3B shows an example, in abstract form, of a computation unit which can also be referred to as a rule. The computation unit can be considered to be like a C function in the C computer programming language or can be considered to be an equation that can be expressed in a computer programming language, which equation is part of the equations used in a physics based simulation to calculate outputs for the simulation. In one embodiment, each equation used in the simulation can be a computation unit. In the example shown in FIG. 3B, the computation unit 151 includes three input variables 153, 154, and 155. These input variables are used in the computation unit to compute to the output variables 157 and 158 based upon the expression or equation or set of equations used in the computation unit 151. The definition, by one or more human programmers, of this computation unit would include a specification of all of these variables and would include an indication of the type of variable, where the type is either input variable or output variable in this example.

FIG. 3C shows an example of the definition 201 of inputs and outputs or input variables and output variables for all of the computation units used in calculating a simulation. This definition implicitly defines the dependencies among the computation units so that a sequence or schedule of executions of the computation units can be scheduled automatically. In one embodiment, this definition uses, for each variable, a unique name or string of characters (e.g., velocity) and a variable type (e.g., input or output). FIG. 3C also shows an example of a list 203 of all variables in the entire simulation, and this list 203 can be used to verify that all variables have been accounted for and defined by the one or more human programmers.

Figure 3D:
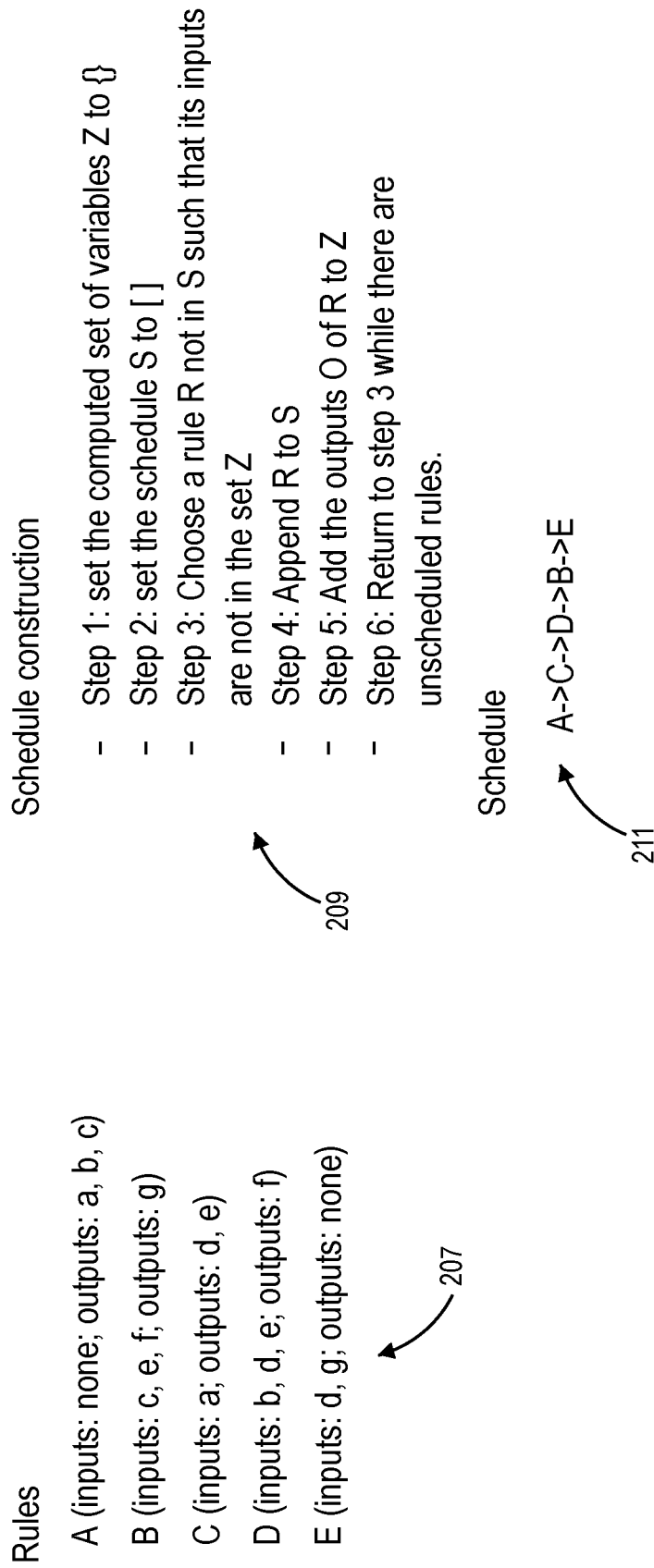
FIG. 3D illustrates an example of how rules or computation units can be defined by one or more programmers and how an execution schedule (that specifies the order or sequence of execution of each of the computation units) can be created.
Figure 3E:
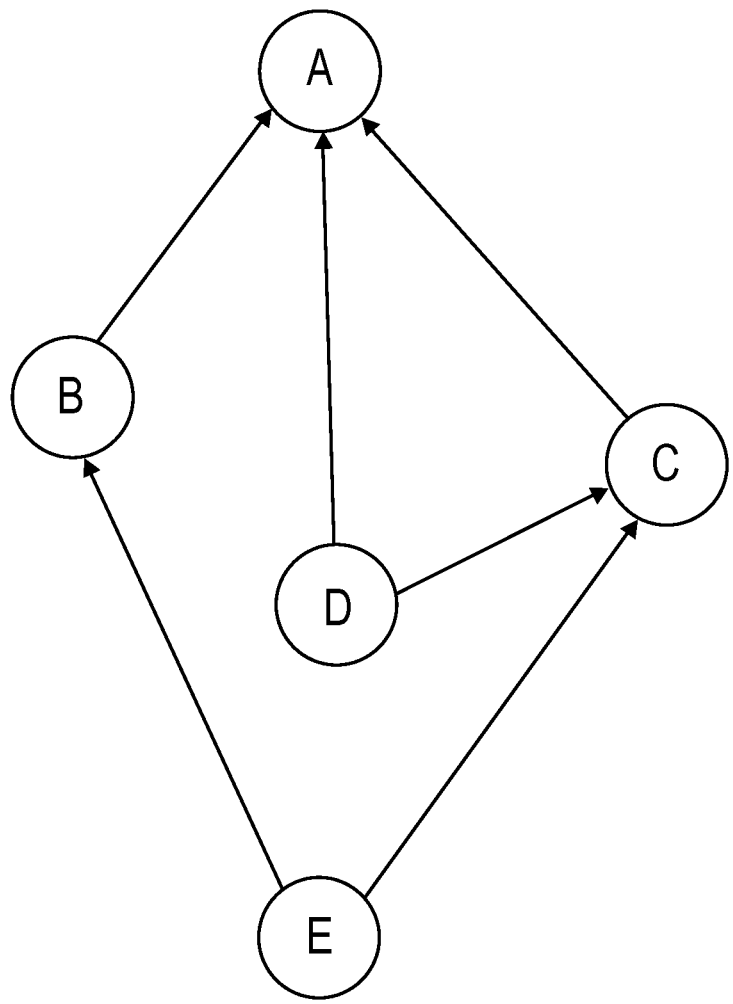
FIG. 3E shows an example of a DAG that can be created according to the one or more embodiments described herein.

FIG. 3D shows an example, in abstract form, of the definition of rules for each computation unit. In the example shown in FIG. 3D, the computation units are labeled as five different computation units, each labeled with the letter. In particular, the computation units or rules in this case include the computation units or rules A, B, C, D, and E. The definition 207 shown in FIG. 3D specifies, for each rule or computation unit, the input variables and the output variables. For example, as shown in the definition 207, computation unit A includes three output variables (a, b, & c) and no input variables; the definition of the computation unit B includes a specification of three input variables (c, e, and f) and one output variable (g); the definition of the computation unit C includes a specification of one input variable (a) and two output variables (d & e); the definition of the computation unit D includes a specification of three input variables (b, d, & e) and one output variable (f); lastly, the definition of the computation unit E includes a specification of two input variables (d & g) and no output variables.

This definition 207 can be used in one or more methods to automatically (without any human programmer input) determine the dependencies among the computation units, and method 209 shown in FIG. 3D can be one of those methods that can automatically determine the dependency relationships among the computation units. The method 209 can begin by initializing a set of variables Z to a null set and initializing a set of scheduled computation units (schedule S) to a null set (see steps 1 and 2 in method 209). Then in the first instance of step 3 in method 209, (when nothing has been scheduled), the method can select a rule (computation unit) that has no input variables in the set of variables Z (for example in this first instance, select rule A which has no input variables in the current set of variables Z). Rule A is selected in this first instance as it depends on no input variables (although it may depend on constants or inputs that are constants specified by the programmer or the end-user at simulation run time). In one embodiment, the program development environment can prompt or remind a programmer to create such a rule or computation unit so that there is at least one such rule that has no input variables. Next, in step 4, the selected rule (rule A in this instance) is appended to the set of scheduled rules (append rule A to S). In step 5, the outputs of the selected rule (output variables of the rule A in the first instance of this step) are added to the set of variables Z. Step 6 determines whether all rules have been processed (for example, scheduled). If there are any rules that have not been processed, the method 209 returns to step 3 to repeat the process of method 209. In the second instance of step 3, rule C can be selected because it has not been scheduled and its input (a) is now in the set of variables Z (having been added in the first instance of step 3). Then steps 4 and 5 are performed for rule C and in step 6 the process returns to step 3 to repeat the process for rules D, then B and then E. Thus, the method 209 automatically determines that rule A depends on no other rule, rule C depends on rule A, rule D depends on rule C and rule A, rule B depends on rule D (and on rules C & A), and roll E depends on rule B (and on rules D, C, and A).

The method 209 as shown in FIG. 3D can be used to determine a schedule 211. Further details regarding the construction of a schedule or execution order will be provided below in conjunction with FIG. 4C. In the example shown in FIG. 3D, the computation units specified by the definition 207 shown in FIG. 3D results in a schedule 211 based upon the determined dependency of all of the variables defined for the computation units in the definition 207. In this schedule, the order of execution in time for the computation units is: first A, then C, then D, then B, and lastly E. The dependencies used to determine the execution order in this example of FIG. 3D can also be described as a directed acyclic graph (DAG) shown in FIG. 3E. Rule A does not depend on any rule, B and C depend on A, D depends on A & C, and E depends on B & C. Rules A, B, C, D, and E from the example shown in FIG. 3D are shown as nodes A, B, C, D, and E in the DAG shown in FIG. 3E.

In the embodiment shown in FIG. 3A, the runtime engine embedded into a compiled executable shown in FIG. 2B can automatically perform memory allocation for non-persistent data such as variables that change during the simulation calculations. Typically, this involves allocating memory for variables (in the computation units) that are in arrays of data, and this allocation can be a dynamic allocation that can change during the simulation calculations to automatically allocate memory for such variables. FIGS. 4A and 4B show examples of a method that can be used in one embodiment.

In operation 251 of FIG. 4A, a data processing system can automatically create an interference graph in which each variable is a node with an edge between nodes if both nodes are simultaneously active (and hence must occupy different memory locations); variables are simultaneously active when they are in the same equation. FIG. 4B shows the creation of the interference graph and will be described further below. In operation 253 in FIG. 4A, the data processing system sorts the nodes which represent the variables in the computation units used in the simulation based on needed memory or required memory for each variable; for example, the node (variable) with the largest amount of required memory is ranked first in this sorted list of nodes and the node (variable) with the least amount of required memory is ranked last in this sorted list of nodes. Then in operation 255, the data processing system selects, from the current set of unallocated nodes, the node with the largest size of required memory. In operation 257, the data processing system marks space in memory for this node with a label; the label can be, for example, a color such as the color K. Then in operation 259, the data processing system can, for the remaining nodes that have not been allocated assign the color K if the node does not share an edge with any node assigned a color of K, and operation 259 is performed in a sequence determined by the amount of memory needed by each remaining variable. Then in operation 261, the data processing system determines whether there are any unallocated nodes (variables). If all nodes have been allocated, then the method proceeds to operation 263 in which memory is allocated for all colors such that memory will be allocated during the running of the simulation for all variables. If operation 261 determines that there are one or more unallocated variables or nodes, processing returns back to operation 255 which repeats the operations, except that the label assigned in operation 257 uses a new color or new label, such as color J (and each instance of operation 257 after returning from operation 261 will use a new label). The method shown in FIG. 4A can relieve a programmer from having to allocate memory for the variables used in the simulations. In many cases, these variables can be large amounts of data which can occupy large portions of memory such as DRAM memory or dedicated memory within a data processing system such as cache memory. This method can also help in low memory environments such as graphics processors (GPUs).

FIG. 4B shows an example of the creation of an interference graph for four variables A, B, C, and D with the sizes of required or needed memory shown in FIG. 4B. In particular, variable A requires a size of 10 (e.g., 10 MB of memory), variable B requires a size of 5, variable C requires a size of 8, and variable D requires a size of 10. Each variable is shown as a node in the interference graph. For example, the variable A is shown as node 303, the variable B is shown as the node 307, the variable C shown as the node 309, and the variable D is shown as the node 305. The process of generating the interference graph can begin by labelling variable D first as it requires the most amount of memory. In the next step shown in FIG. 4B, the data processing system determines that the variable C does not share an edge with the variable D so the variable C also gets labeled with the label used for variable D (color 1). At this point, the interference graph shows that variables D and C have been labeled with the label of color 1; also at this point, the variable A now has the largest size of needed memory and is still unallocated. The data processing system can then label the variable A with the next label which can be color 2. Then the data processing system determines that the variable B does not share an edge with the variable A, so variable B can also be assigned the same label as variable A (color 2). This allocation of non-persistent data (variables) produces a result in which variables A and B have the same address (a block of size 10) and variables C and D have the same address (a block of size 10).

FIG. 4C shows an example of a method for scheduling computation units according to one embodiment. This scheduling method can be used in the methods shown in FIG. 2A and FIG. 3A. For example, the method shown in FIG. 4C can be used in operation 55 of FIG. 2A and can be used in operation 107 in FIG. 3A. Scheduling performed in the method shown in FIG. 4C adds a computation unit to the end of the list of computation units to execute. This method can use a special "output" computation unit which acts as a sink that is always scheduled last. Any computation unit or node that is not used because its outputs are ignored (and therefore not used) is also left unscheduled. In operation 351, the data processing system in a program development environment can schedule a node with no dependencies. The rule A in FIG. 3D is an example of such a computation unit which can be initially scheduled in operation 351. If this node is the first node being scheduled, it will be the first node in the computational graph. Then in operation 353, the data processing system can decrease a dependency count by one for each child of the node that was just scheduled in operation 351. Then in operation 355, the data processing system can determine whether there are any unscheduled nodes. Nodes whose outputs are not used are not considered in operation 355 and hence are ignored, in effect treating them as if they have been scheduled. If all nodes that require scheduling have been scheduled then processing proceeds to operation 357 which in this embodiment adds an output rule (which acts as a sink) at the end of the execution list. If operation 355 determines that there are unscheduled nodes that require scheduling, then processing returns back to operation 351 and the method continues until all nodes that require scheduling are scheduled. The schedule produced by the method shown in FIG. 4C can produce the schedule 211 shown in FIG. 3D in one embodiment.

Figure 5:
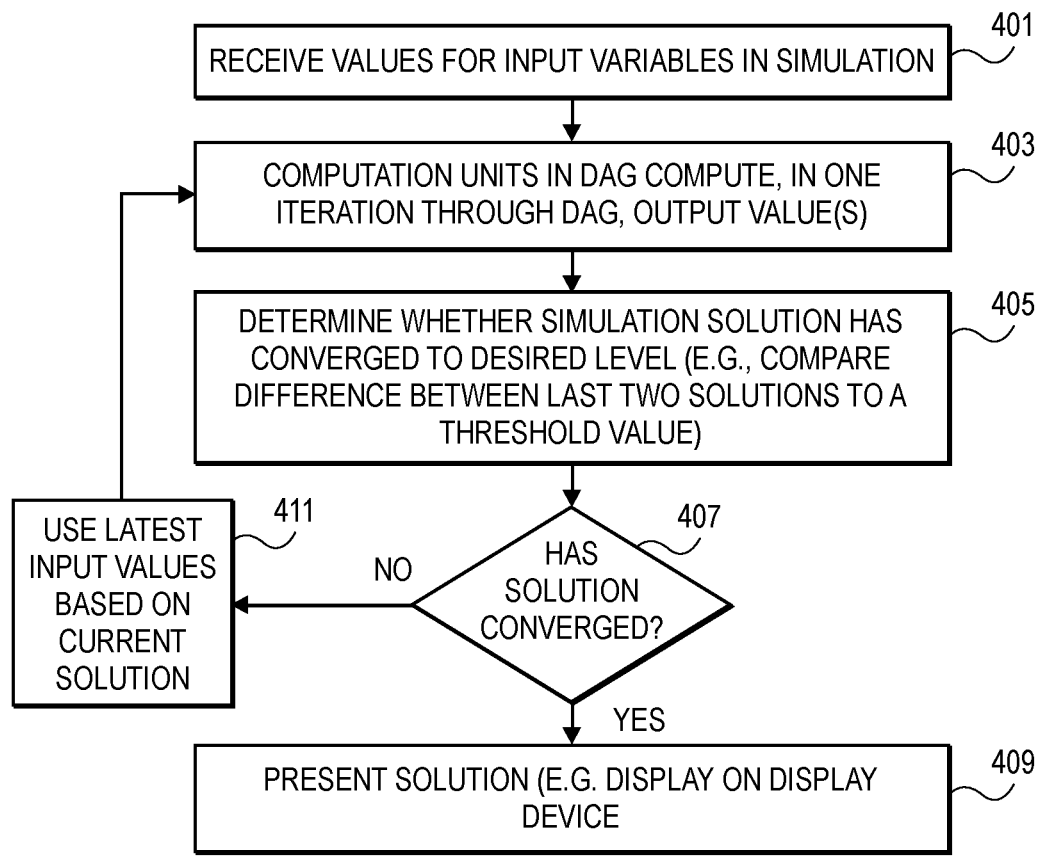
FIG. 5 shows an example of a method of using the constructed DAG in the created software during simulation run time.

Once a computer program has been created using one of the embodiments described herein, it can be used in simulations by executing the computation graph which can be in the form of a DAG. The computation graph can be represented in the computer program by programming statements or instructions added by the program development environment based upon the definition of each of the computation units and after the definitions have been used to determine dependency relationship among the computation units and to schedule their execution. The simulations can be performed at runtime of the computer program by customers or licensees of the computer program, and FIG. 5 shows an example of a simulation at runtime of the computer program. These customers or licensees can create values for the input variables and can input those values which are received by the computer program in operation 401. Then in operation 403, the data processing system can compute, for each of the computation units, values of one or more output variables. Operation 403 represents a single iteration through an entire computation graph to compute the one or more output values. Then in operation 405, the data processing system can determine whether a simulation solution has been achieved based upon a test for a converged solution. Techniques known in the art can be used for this test; for example, the data processing system can compare the difference between the last two solutions to a threshold value. The threshold value can be set to a small number to require that the difference be a small number. When the difference is equal to or less than the threshold value, this indicates that the solution has converged because the difference between the last two solutions has become small enough to be considered a converged solution. Operation 407 is a test for convergence, and if the solution has converged, then operation 409 can be performed. In one embodiment, operation 409 can be the display of the solution on a display device that is coupled to the data processing system. If the test in operation 407 reveals that the solution has not converged, processing proceeds to operation 411; in operation 411, the latest input values derived from the most recent solution are used as the next input values in operation 403 which repeats another iteration through the computation graph to derive output values and this process repeats until a converged solution is obtained.

Figure 6:
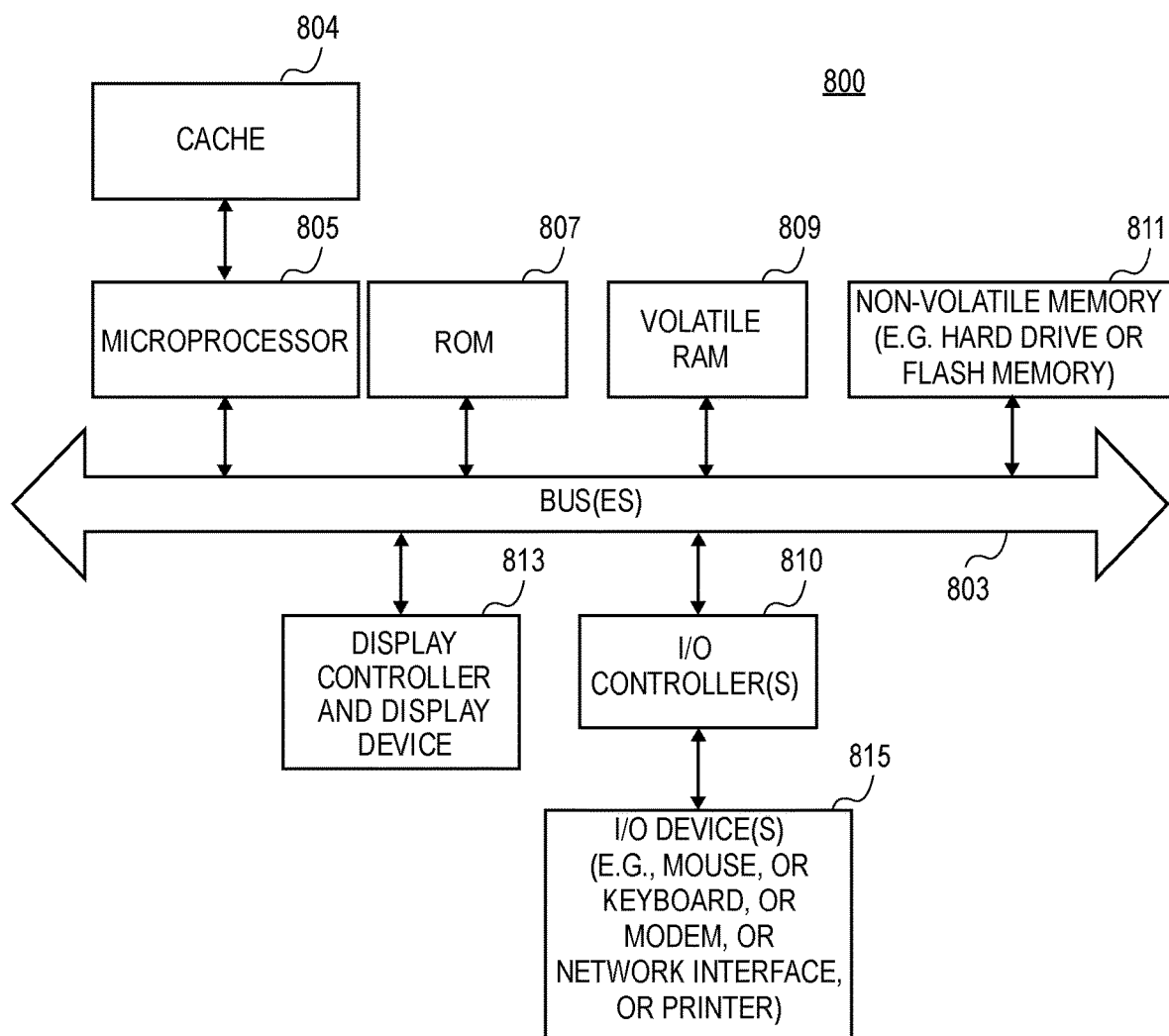
FIG. 6 shows an example of a data processing system that can be used to create a computer program that includes a computation graph (e.g., one or more DAGs) that can be used to simulate physical systems, and the data processing system shown in FIG. 6 can also be used during simulation run time.

FIG. 6 shows one example of a data processing system 800, which may be used with one embodiment. For example, the data processing system 800 may be implemented to provide a program development environment or system that performs the method of FIGS. 2A or 3A or other methods described herein. Moreover, the data processing system 800 can be used at runtime of the simulation and perform the method shown in FIG. 5. Further, the data processing system 800 can be used to implement the program development environment 75. Note that while FIG. 6 illustrates various components of a device, it is not intended to represent any particular architecture or manner of interconnecting the components as such details are not germane to the disclosure. It will also be appreciated that network computers and other data processing systems or other consumer electronic devices, which have fewer components or perhaps more components, may also be used with embodiments of the disclosure.

As shown in FIG. 6, the device 800, which is a form of a data processing system, includes a bus 803 which is coupled to a microprocessor(s) 805 and a ROM (Read Only Memory) 807 and volatile RAM 809 and a non-volatile memory 811. The microprocessor(s) 805 may retrieve the instructions from the memories 807, 809, 811 and execute the instructions to perform operations described above. The microprocessor(s) 805 may contain one or more processing cores. The bus 803 interconnects these various components together and also interconnects these components 805, 807, 809, and 811 to a display controller and display device 813 and to peripheral devices such as input/output (I/O) devices 815 which may be touchscreens, mice, keyboards, modems, network interfaces, printers and other devices which are well known in the art. Typically, the input/output devices 815 are coupled to the system through input/output controllers 810. The volatile RAM (Random Access Memory) 809 is typically implemented as dynamic RAM (DRAM), which requires power continually in order to refresh or maintain the data in the memory.

The non-volatile memory 811 is typically a magnetic hard drive or a magnetic optical drive or an optical drive or a DVD RAM or a flash memory or other types of memory systems, which maintain data (e.g., large amounts of data) even after power is removed from the system. Typically, the non-volatile memory 811 will also be a random access memory although this is not required. While FIG. 6 shows that the non-volatile memory 811 is a local device coupled directly to the rest of the components in the data processing system, it will be appreciated that embodiments of the disclosure may utilize a non-volatile memory which is remote from the system, such as a network storage device which is coupled to the data processing system through a network interface such as a modem, an Ethernet interface or a wireless network. The bus 803 may include one or more buses connected to each other through various bridges, controllers and/or adapters as is well known in the art.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.), and/or electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The disclosure also relates to an apparatus for performing the operations described herein. This apparatus may be specially constructed for the required purpose, or it may comprise a general-purpose device selectively activated or reconfigured by a computer program stored in the device. Such a computer program may be stored in a non-transitory computer readable storage medium, such as, but not limited to, any type of disk including floppy disks, optical disks, CD-ROMs, and magnetic-optical disks, DRAM (volatile), flash memory, read-only memories (ROMs), RAMs, EPROMs, EEPROMs, magnetic or optical cards, or any type of media suitable for storing electronic instructions, and each coupled to a device bus.

A machine readable medium includes any mechanism for storing information in a form readable by a machine (e.g., a computer). For example, a non-transitory machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more non-transitory memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)) and then stored in non-transitory memory (e.g., DRAM or flash memory or both) in the client computer.

The preceding detailed descriptions are presented in terms of algorithms and symbolic representations of operations on data bits within a device memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "sending," "terminating," "waiting," "changing," or the like, refer to the action and processes of a device, or similar electronic computing device, that manipulates and transforms data represented as physical (electronic) quantities within the device's registers and memories into other data similarly represented as physical quantities within the device memories or registers or other such information storage, transmission or display devices.

The processes and displays presented herein are not inherently related to any particular device or other apparatus. Various general-purpose systems may be used with programs in accordance with the teachings herein, or it may prove convenient to construct a more specialized apparatus to perform the operations described. The required structure for a variety of these systems will be evident from the description below. In addition, the disclosure is not described with reference to any particular programming language. It will be appreciated that a variety of programming languages may be used to implement the teachings of the disclosure as described herein.

In the foregoing specification, specific exemplary embodiments have been described. It will be evident that various modifications may be made to those embodiments without departing from the broader spirit and scope set forth in the following claims. The specification and drawings are, accordingly, to be regarded in an illustrative sense rather than a restrictive sense.

What is claimed is:

1. A method for creating software that performs physics simulations of physical systems, the method comprising:
   defining a set of computation units for simulating a physical system, each computation unit comprising one or more variables representing characteristics of the physical system, and the one or more variables comprising a set of input and output variables, wherein each computation unit comprises an equation having one or more variables including an input variable and an output variable;

automatically determining a set of dependency relationships among the computation units based upon the variables in all of the computation units;

automatically generating a representation of a schedule of execution for the computation units based on their determined dependencies;

creating an executable representation of the computation units with an execution order specified by the schedule, the executable representation being stored as part of the software, wherein the set of input and output variables are specified in a set of one or more equations that define the dependencies, and the set of one or more equations are used in a simulation performed by the software when executed; and generating a directed acyclic graph (DAG) having a set of nodes representing the set of computation units, wherein the DAG is generated after automatically determining the set of dependency relationships and is based on the automatically determined set of dependency relationships, and, wherein, the DAG is a directed graph without any cycles.

2. The method as in claim 1, wherein the method further comprises:

automatically determining memory allocations for the computation units based on the determined dependencies.

3. The method as in claim 1, wherein the stored computation units, which have their execution order specified by the schedule, represent a computation graph that is presentable as the DAG having the set of nodes, each of the nodes representing one of the computation units.

4. The method as in claim 3, wherein each computation unit is represented in a computer programming language.

5. The method as in claim 4, wherein the method further comprises:

displaying the DAG on a display device, wherein the DAG is a finite directed graph with no cycles, and the DAG specifies the flow of computations among the computation units.

6. The method as claim 4, wherein the method further comprises:

displaying, while debugging the software, a comparison of the inputs and outputs of each computational unit between two successive versions of the software.

7. The method as in claim 4, wherein the method further comprises:

executing the computations in the computation units in an order specified by the schedule once for each iteration through the DAG, wherein the method uses multiple iterations to derive a converged solution in a simulation.

8. The method as in claim 4, wherein each variable in the set of input and output variables is defined by a unique string of characters and a type of variable, and wherein the defining of the set of computation units is performed by one or more human programmers.

9. The method as in claim 8, wherein the DAG is automatically constructed by a data processing system, which executes a program development environment, from the definition of the set of computation units.

10. The method as in claim 2, wherein the memory allocations are specified by a memory coloring algorithm.

11. A non-transitory machine readable medium storing executable program instructions which when executed by a data processing system cause the data processing system to perform a method for creating software that performs physics simulations of physical systems, the method comprising:

receiving a set of computation units for simulating a physical system, each computation unit comprising one or more variables representing characteristics of the physical system, and the one or more variables comprising a set of input and output variables, wherein each computation unit comprises an equation having one or more variables including an input variable and an output variable;

automatically determining a set of dependency relationships among the computation units based upon the variables in all of the computation units;

automatically generating a representation of a schedule of execution for the computation units based on their determined dependencies;

creating an executable representation of the computation units with an execution order specified by the schedule, the executable representation being stored as part of the software, wherein the set of input and output variables are specified in a set of one or more equations that define the dependencies, and the set of one or more equations are used in a simulation performed by the software when executed; and generating a directed acyclic graph (DAG) having a set of nodes representing the set of computation units, wherein the DAG is generated after automatically determining the set of dependency relationships and is based on the automatically determined set of dependency relationships, and, wherein, the DAG is a directed graph without any cycles.

12. The medium as in claim 11, wherein the method further comprises:

automatically determining memory allocations for the computation units based on the determined dependencies.

13. The medium as in claim 11, wherein the stored computation units, which have their execution order specified by the schedule, represent a computation graph that is presentable as the DAG having the set of nodes, each of the nodes representing one of the computation units.

14. The medium as in claim 13, wherein each computation unit is represented in a computer programming language.

15. The medium as in claim 14, wherein the method further comprises:

displaying the DAG on a display device, wherein the DAG is a finite directed graph with no cycles, and the DAG specifies the flow of computations among the computation units.

16. The medium as in claim 14, wherein the method further comprises:

displaying, while debugging the software, a comparison of the inputs and outputs of each computational unit between two successive versions of the software.

17. The medium as in claim 14, wherein the method further comprises:

executing the computations in the computation units in an order specified by the schedule once for each iteration through the DAG, wherein the method uses multiple iterations to derive a converged solution in a simulation.

18. The medium as in claim 14, wherein each variable in the set of input and output variables is defined by a unique string of characters and a type of variable, and wherein the set of computation units is defined by one or more human programmers.

19. The medium as in claim 18, where the DAG is automatically constructed by a data processing system, which executes a program development environment, from the definition of the set of computation units.

20. The medium as in claim 12, wherein the memory allocations are specified by a memory coloring algorithm.

* * * * *